United States Patent [19]

Matsui et al.

[11] Patent Number: 5,403,630
[45] Date of Patent: Apr. 4, 1995

[54] VAPOR-PHASE GROWTH METHOD FOR FORMING $S_2O_2$ FILMS

[75] Inventors: Isao Matsui, Tokorozawa; Akio Ui, Tokyo, both of Japan

[73] Assignee: Kabushiki Kaisha Toshiba, Kawasaki, Japan

[21] Appl. No.: 141,636

[22] Filed: Oct. 27, 1993

[30] Foreign Application Priority Data

Oct. 27, 1992 [JP] Japan .................. 4-288407

[51] Int. Cl.$^6$ .................. B05D 3/06; C23C 16/00
[52] U.S. Cl. .................. 427/583; 427/595; 427/255.3; 427/255.2; 427/255.1; 437/238
[58] Field of Search .............. 427/579, 578, 595, 574, 427/583, 255.3, 255.2, 255.1; 437/238

[56] References Cited

U.S. PATENT DOCUMENTS

| | | | |
|---|---|---|---|
| 4,371,587 | 2/1983 | Peters | 427/582 |
| 4,597,609 | 4/1986 | Reif et al. | 148/175 |
| 4,872,947 | 10/1989 | Wang et al. | 427/585 |
| 4,895,734 | 1/1990 | Yoshida et al. | 427/576 |

FOREIGN PATENT DOCUMENTS 61-77695  4/1986  Japan .
3-41731   2/1991  Japan .
4-213829  8/1992  Japan .

OTHER PUBLICATIONS

Webb et al, "Silicon dioxide films produced by PECVD of TEOS and TMCTS", Proc.-Electrochem. Soc., 89-9 (ULSI Sci. Technol. 1989) pp. 571-585.
Proceedings of Electrochemical Society Spring Meeting, J. Sato, et al., p. 31, Abstract No. 9, 1971.

*Primary Examiner*—Roy V. King
*Attorney, Agent, or Firm*—Oblon, Spivak, McClelland, Maier & Neustadt

[57] ABSTRACT

A vapor-phase growth method comprising the steps of introducing a silicon-containing gas and ozone into a reaction vessel containing a sample, and introducing excited oxygen obtained by exciting an oxygen gas or an oxygen-containing gas, into the reaction vessel at the same the as, before, or after the silicon-containing gas and the ozone are introduced into the reaction vessel. The silicon-containing gas and the ozone react, forming an intermediate product which can readily condense. The intermediate product reacts with the excited oxygen, thereby forming a thin insulating film which excels in step coverage and has good insulating property.

48 Claims, 8 Drawing Sheets

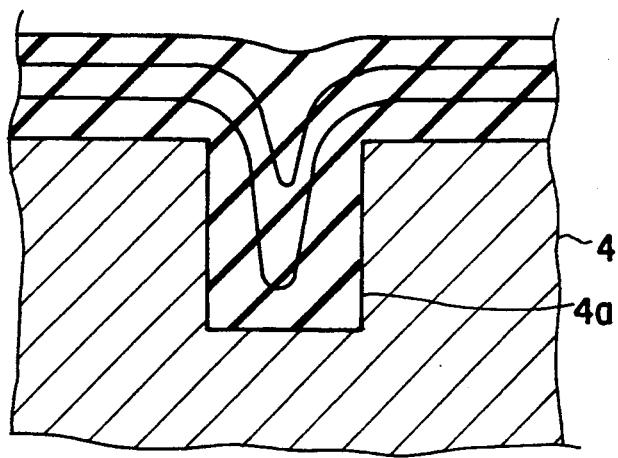
F I G. 3
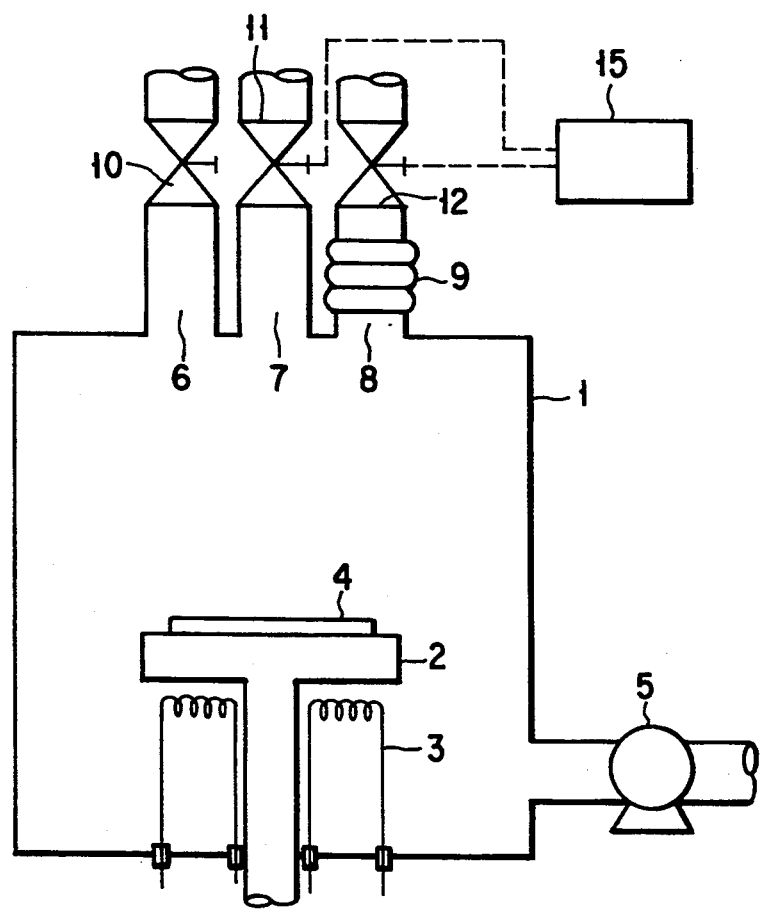
F I G. 4

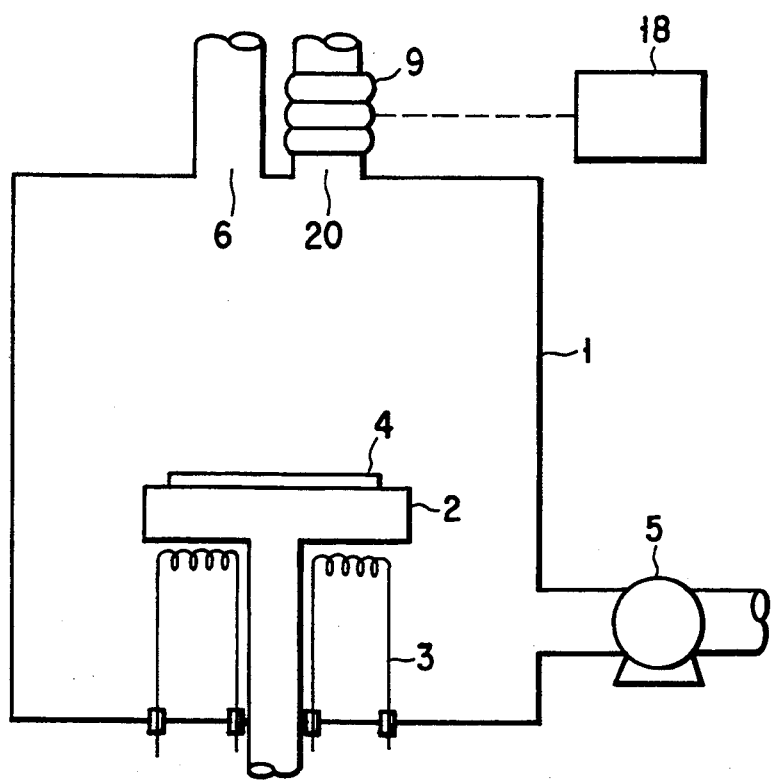
F I G. 9
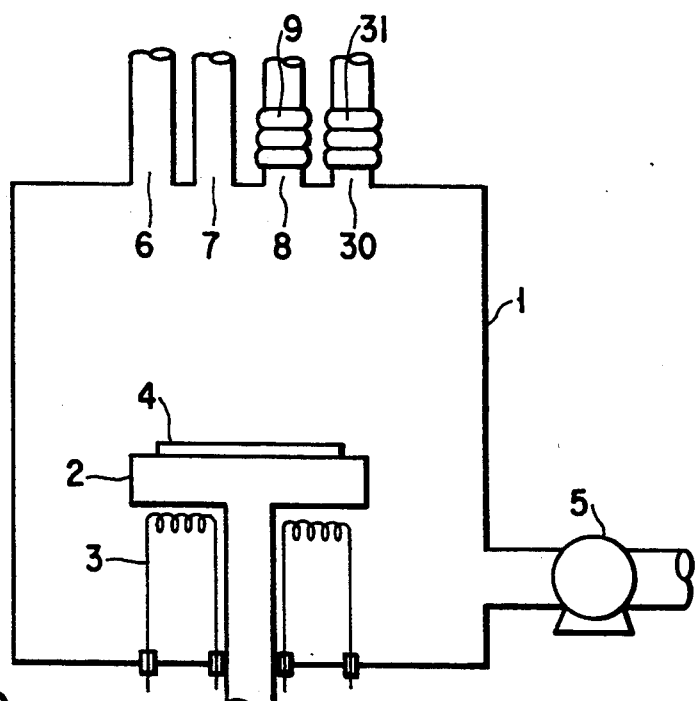
F I G. 10

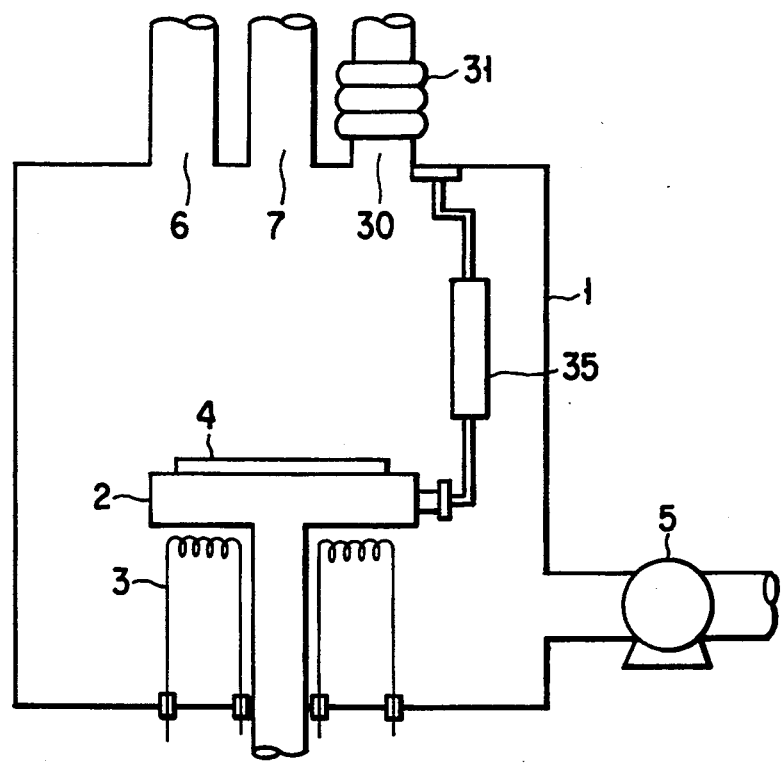
F I G. 13
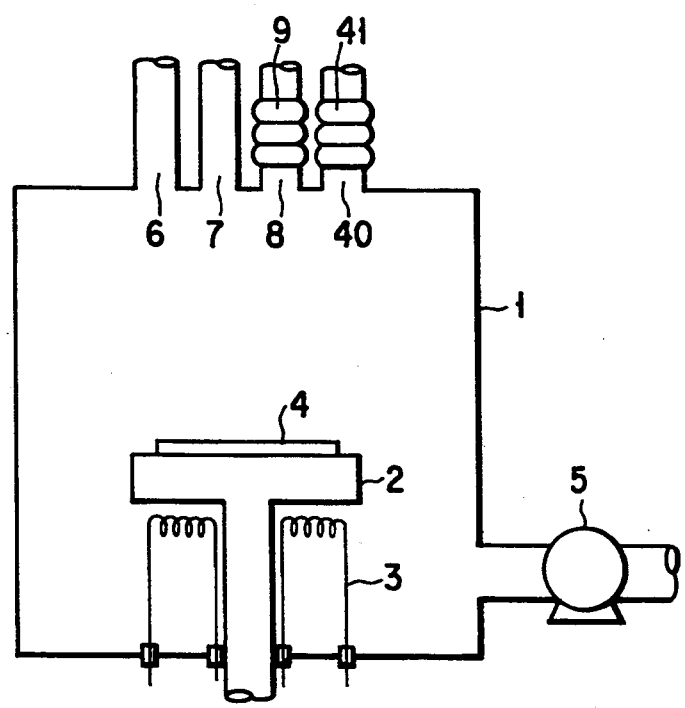
F I G. 14

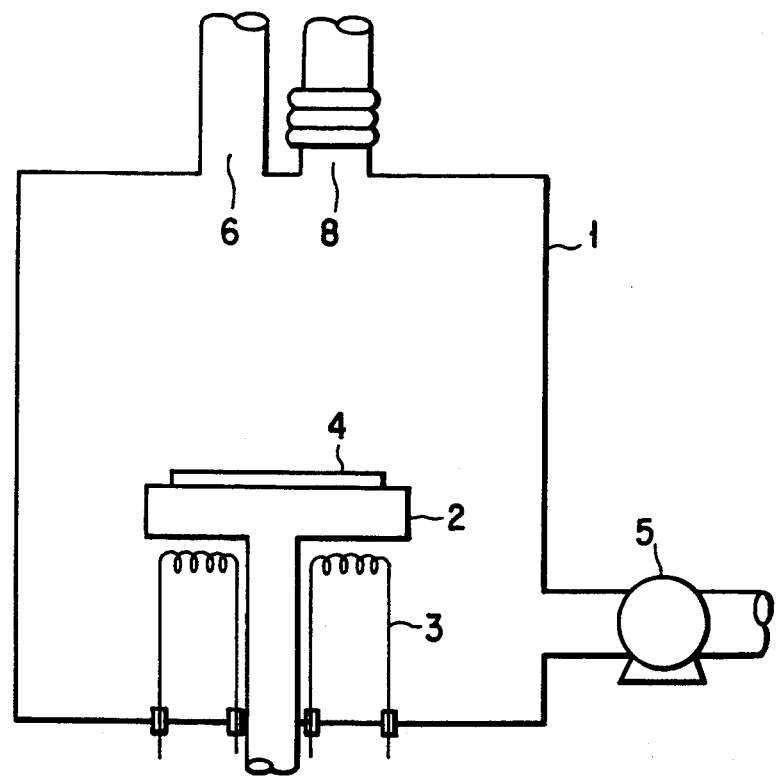
F I G. 15
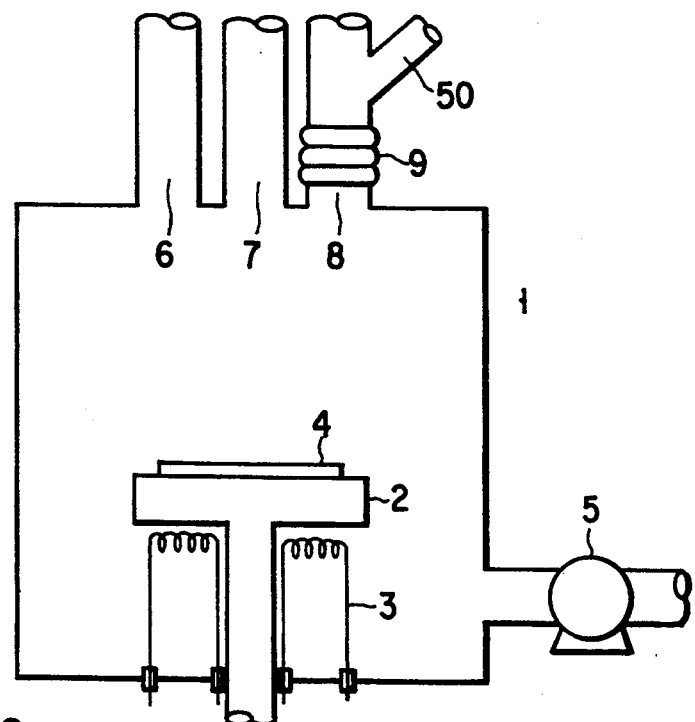
F I G. 16

VAPOR-PHASE GROWTH METHOD FOR FORMING $S_2O_2$ FILMS

BACKGROUND OF THE INVENTION

1. Field of the Invention

The present invention relates to a vapor-phase growth method in which a thin film is formed on the surfaces of semiconductor substrates, and which is employed in the process of manufacturing semiconductor devices such as VLSI (Very Large Scale Integration) devices.

2. Description of the Related Art

A CVD (Chemical vapor Deposition) method used in manufacturing semiconductor devices such as VLSI devices is a method wherein a thin film is formed on a semiconductor substrate, utilizing chemical reaction proceeding at the surface of the substrate or in the vapor phase over the surface of the substrate. The method finds its main use in forming an insulating film such as a silicon oxide film or a silicon nitride film.

A thin-film deposition technique, which forms a thin film with good step coverage, on the surface of a semiconductor substrate and in trenches formed in the surface thereof and having a high aspect ratio (a depth-to-width ratio), is becoming indispensable to the manufacture of recently developed VLSI devices. The conventional CVD method (e.g., the one disclosed in J. L. Vossen & W. Kern, *Thin Film Process*, Academic Press, 1978) may be employed to form, as shown in FIG. 1, a silicon oxide film 100 in a trench 104a made in the surface of a silicon substrate 104. When it is employed for this purpose, however, the species formed in the vapor phase is deposited more on an edge of the trench 104a than on any other part thereof. This makes it increasingly difficult for the species to deposit on the bottom of the trench 104a. Consequently, a hole is left in the trench 104a, and the resultant thin film will have but poor step coverage.

Where a silicon oxide film is formed by a method of thermally decomposing TEOS (Tetraethoxysilane) (e.g., the method disclosed in R. D. Rang, Y. Momose & Y. Nagkubo, *IEDM. TECH. DIG.*, 1982, p. 237), a deposition temperature must be at least 600° C. At so high a temperature as this, it is difficult to form a thin film on an aluminum wiring having a low melting temperature.

According to TEOS plasma CVD, it is possible to deposit $SiO_2$ at a low temperature. In this method, however, since TEOS decomposes excessively in plasma, it is difficult to form a $SiO_2$ film having a good step coverage.

Another method of forming a thin film is known, in which use is made of reaction between TEOS and ozone. This method can indeed provide fairly good step coverage. The film formed by the method is not sufficiently insulating since ozone is not so reactive. Inevitably, any device having a thin film formed by this method has but a short lifetime.

As described above, with the conventional methods it is difficult to form a highly insulating thin film exhibiting good step coverage, on the surface of a semiconductor substrate and in a trench formed in the surface thereof and having a high aspect ratio.

SUMMARY OF THE INVENTION

In view of the foregoing, it is an object of the present invention to provide a vapor-phase growth method which can form a highly insulating thin film having good step coverage, at low temperatures on a semiconductor substrate and in a trench made in the surface thereof and having a high aspect ratio.

According to an aspect of the invention, there is provided a vapor-phase growth method comprising the steps of: introducing a silicon-containing gas and ozone into a reaction vessel containing a sample; and introducing excited oxygen obtained by exciting oxygen gas or an oxygen-containing gas, into the reaction vessel at the same time as, before, or after the silicon-containing gas and the ozone are introduced into the reaction vessel.

According to another aspect of this invention, there is provided a vapor-phase growth method comprising the steps of: introducing a silicon-containing gas into a reaction vessel containing a sample; and introducing ozone and excited oxygen, both obtained by exciting oxygen gas or an oxygen-containing gas, into the reaction vessel at the time as, before, or after the silicon-containing gas is introduced into the reaction vessel.

According to still another aspect of the present invention, there is provided a vapor-phase growth method comprising the steps of: introducing a silicon-containing gas and ozone into a reaction vessel containing a sample; and introducing an excited gas incapable of forming a reaction product, into the reaction vessel at the same time as, before, or after the silicon-containing gas and the ozone are introduced into the reaction vessel.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a cross-sectional view of a semiconductor substrate, illustrating the advantage of the vapor-phase growth method according to the invention;

FIG. 4 is a side view schematically showing a vapor-phase growth apparatus for effecting a second embodiment of the present invention;

FIG. 9 is a side view schematically showing a vapor-phase growth apparatus for effecting a sixth embodiment of the present invention;

FIG. 10 is a side view schematically showing a vapor-phase growth apparatus for performing a seventh embodiment of the invention;

FIG. 13 is a side view schematically showing a modification of the vapor-phase growth apparatus shown in FIG. 12;

FIG. 14 is a side view schematically showing a vapor-phase growth apparatus for performing a tenth embodiment of this invention;

FIG. 15 is a side view schematically showing a vapor-phase growth apparatus for carrying out an eleventh embodiment of the invention; and FIG. 16 is a side view schematically showing a vapor-phase growth apparatus for performing a twelfth embodiment of the present invention.

DETAILED DESCRIPTION OF THE PREFERRED EMBODIMENTS

Figure 1:
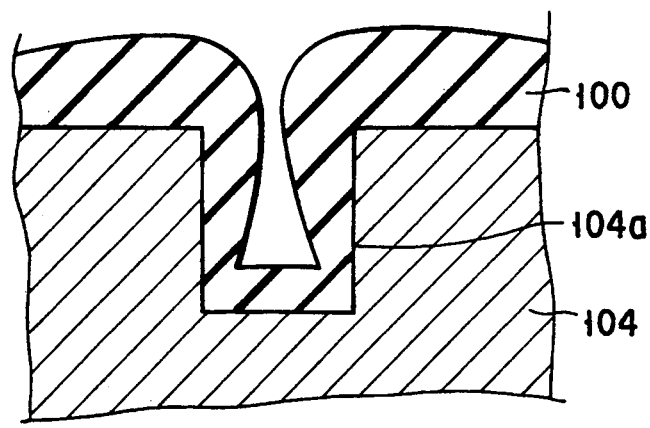
FIG. 1 is a cross-sectional view of a semiconductor substrate, for explaining how a thin film is formed on the substrate and in a trench formed in the surface thereof by a conventional method.

The method according to the present invention is to form a highly insulating thin film having good step coverage, on a semiconductor substrate, particularly a substrate having a trench. The method is characterized in that ozone and a silicon-containing gas are introduced into a reaction vessel, thereby forming a condensative intermediate product. The condensed intermediate product exhibits excellent step coverage, and the intermediate product is reacted with excited oxygen (O).

The silicon-containing gas used in the method of the present invention may be an organic oxysilane compound. Examples of the organic oxysilane compound are tetraethoxysilane (TEOS), tetramethoxysilane, tetraethyl silane, tetramethyl silane, triethoxysilane, diethoxysilane, monoethoxysilane and the like.

The source of the excited oxygen is not limited to oxygen gas. An oxygen-containing gas can be used as an excited oxygen source. The oxygen-containing gas may be either a mixture of oxygen gas and other gases, such as air, or an oxygen compound gas, such as $NO_2$, $N_2O$ and or the like.

Excited oxygen can be formed by applying ultraviolet rays to oxygen gas or oxygen-containing gas, or by subjecting the oxygen gas or oxygen-containing gas to plasma discharge.

Ozone, which is reacted with the silicon-containing gas to form an intermediate product and is therefore required in the present invention, need not be supplied in the form of a feed gas. This is because ozone is formed when oxygen is excited under a high pressure.

The flow rate ratio among ozone, oxygen, and silicon-containing gas is preferably 1:1:100 to 1:100:100. The reaction temperature is preferably 100° to 400° C. The pressure in the reaction vessel is preferably 1 to 10000 Pa. It is desirable that the substrate on which to form a thin film be maintained at 100° to 400° C.

As mentioned above, in the method of this invention, ozone and silicon-containing gas are reacted, thereby forming an intermediate product, and the intermediate product reacts with excited oxygen. The intermediate product condenses into a liquid. A part of the liquid flows into a trench formed in the surface of a sample. The remaining part of the condensed intermediate product remains in the space within the reaction vessel. If this part of the condensed intermediate product reacts with the excited oxygen, a product will be formed in the space within the reaction vessel, in the form of powder or dust.

Forming of powder or dust can be prevented by alternately introducing ozone and excited oxygen into the reaction vessel. First, ozone is introduced into the reaction vessel, along with silicon-containing gas, whereby the ozone and the silicon-containing gas react with each other in the vessel, forming the intermediate product. After the intermediate product has been deposited in the trench, excited oxygen is introduced into the vessel, in place of ozone. Powder or dust, which would be formed if silicon-containing gas, ozone, and excited oxygen were introduced together into the vessel, is not formed in the space within the reaction vessel. As a result, a thin film containing no impurities is formed deep within the trench.

In the method of the present invention, a gas plasma-excited and not contributing to reaction, such as rare gas (e.g., Ar, $Ar^+$, He, $He^+$, Xe, $Xe^+$, Ne, or $Ne^+$), can be introduced into the reaction vessel, together with silicon-containing gas, ozone and excited oxygen. As the rare gas is applied onto the surface of the sample, Ar or $Ar^+$ excited with plasma impinges on the surface of the sample, expelling $H_2O$ from the film already deposited on the sample. Dehydration is thereby accomplished at the surface of the sample, and the film can grow into a highly insulating one. A bias voltage may be applied on the sample, thereby promoting the impinging of Ar or $Ar^+$ onto the surface of sample and subsequently achieving efficient dehydration at the surface of the sample.

Moreover, in the method of this invention, a gas containing a group VII element, such as $NF_3$, $CF_4$, $C_2F_6$, $C_4F_{10}$, $C_3H_8$, $CCl_4$, or the like can can be introduced into the reaction vessel, together with silicon-containing gas, ozone and excited oxygen. $NF_3$ generates F when converted into plasma. F etches either edge of a trench made in the surface of a substrate. Since the intermediate reaction product formed by virtue of the reaction between ozone and silicon-containing gas hardly adheres to the vertical surfaces of the trench, it accumulates on the bottom of the trench. As a result, a thin film is formed on the surface of the substrate and in the trench, achieving good step coverage. The thin film, thus formed on the surface of the substrate, has a flat upper surface in spite of the trench made in the surface of the substrate.

Furthermore, in the method of the invention, rare gases, such as He and Ne, can be mixed with oxygen gas in specific ratio thereto. The resultant gas mixture is excited with plasma, thereby generating excited oxygen—in an increased amount. This is because, as excited metastable He (He*) is generated in the plasma, oxygen gas is dissociated, and the dissociate oxygen gas ($O_2^*$) is immediately decomposed into oxygen atoms.

Collision cross section in the reaction for forming metastable He (He*) is larger than that in the reaction for exciting oxygen. Hence, the reaction for forming metastable He (He*) readily occurs. It follows that the dissociation of oxygen gas and the decomposition of the dissociated oxygen gas into oxygen atoms can readily take place. Oxygen atoms and ozone are, therefore, generated in large quantities. Thus, when He is added to oxygen gas, more oxygen atoms are generated where the oxygen gas ($O_2$) is excited with plasma into oxygen atoms (O). AS a result, a thin film can be formed with high efficiency.

A thin film can be formed efficiently, too, by introducing into the reaction vessels a gas which easily changes to cations or a gas which readily generates cations.

When a gas which easily changes to cations is mixed with oxygen gas, more cations are formed in the plasma than otherwise. These cations impinge on the electrode located in the vessel or collide with the molecules of other gas and release electrons e. The more electrons e, the faster the oxygen gas is decomposed. Thus, when the oxygen gas ($O_2$) is excited with plasma only into oxygen atoms (O), more oxygen atoms are generated by virtue of the mixture of oxygen gas and the gas which easily changes to cations. A thin film is thereby formed, which has good step coverage.

On the other hand, when a gas which readily generates cations, such as He or Ne, is mixed with oxygen gas, the gas is excited into an excited metastable He* or Ne*. The excited metastable He* or Ne* collides with another gas X, generating cations (X+). (This phenomenon is generally known as "Penning effect".) Cations (X+) and electrons in the plasma increases in numbers, the electrons in the plasma increases in numbers due to the cations, whereby the decomposition of the oxygen gas is accelerated. It should be noted that Penning effect also serves to ionize oxygen gas.

As described above, the plasma excites the oxygen gas ($O_2$), whereby oxygen atoms (O) are generated in great numbers by virtue of the gas which has been added to the oxygen gas and which readily generates cations. Therefore, a thin film is formed which exhibits good step coverage.

Examples of the gas which easily changes to cations are: nitrogen monoxide, carbon monoxide, nitrogen, krypton, xenon, argon, vapor of an group I or II element, and the like. Examples of the gas which readily generates cations are: helium, neon, krypton, xenon, argon, and the like.

Embodiments of the present invention will be described, with reference to the accompanying drawings.
Embodiment 1.

Figure 2:
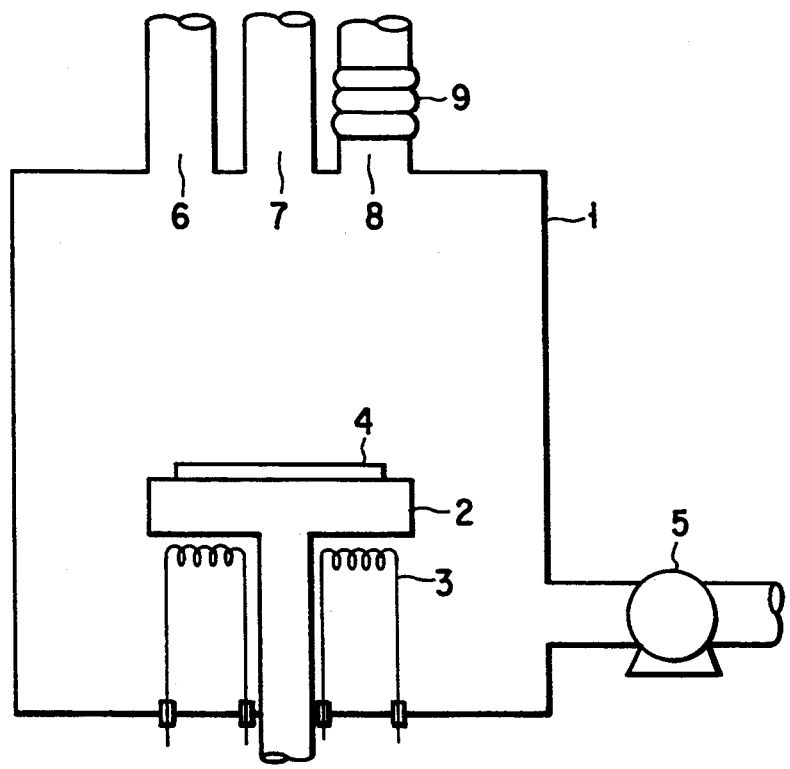
FIG. 2 is a side view schematically showing a vapor-phase growth apparatus for performing a first embodiment of the present invention.

FIG. 2 schematically shows a vapor-phase growth apparatus for performing a vapor-phase growth method which is a first embodiment of the present invention.

As shown in FIG. 2, the apparatus comprises a reaction vessel 1, a sample holder 2 located in the vessel 1, and a heater 3 arranged below the sample holder 2. The heater 3 can heat a sample 4 placed on the holder 2 to a desired temperature ranging, for example, from about 300° C. to 400° C. An exhaustion device 5 is connected to the bottom of the vessel 1, for exhausting residual gases and the like from the reaction vessel 1.

Gas inlets 6, 7 and 8 are provided in the top of the vessel 1, for introducing a feed gas, a first reaction gas, and the second reaction gas, respectively, into the reaction vessel 1. More specifically, the second reaction gas is converted into plasma by an excitation device 9 connected to the gas inlet 8 and is then supplied into the vessel through the gas inlet 8. Simultaneously, the feed gas and the first reaction gas are introduced into the vessel 1, without being changed into plasma.

Of the feed gas, the reaction gases, and the reaction products, those (i.e., residual gases) not contributing to deposition of a thin film on the sample 4 are exhausted from the reaction vessel by means of the exhaustion device 5.

The first embodiment of the invention, i.e., a vapor-phase growth method for depositing a thin film on the sample 4 by means of the apparatus shown in FIG. 2 will now be explained.

In the method, a silicon-containing gas, such as TEOS (Tetraethoxysilane), is used as the feed gas, and ozone ($O_3$) and oxygen ($O_2$) are used as the first and second reaction gases, respectively. TEOS and ozone are introduced into the reaction vessel 1 via the gas inlets 6 and 7, respectively, without being converted into plasma. At the same time, oxygen is supplied into the vessel 1 via the gas inlet 8 after having been excited by the excitation device 9.

In the reaction vessel 1, TEOS, ozone, and plasma-excited oxygen chemically react on the surface of the sample 4, in which narrow trenches are formed, thereby growing an insulating film on the surface of the sample 4 and in the trenches. In the process, an intermediate product formed in the process condenses into liquid, and readily flows into each trench, not staying on either edge of the trench. A thin film having good step coverage can therefore be formed on the surface of the sample 4.

An experiment was conducted in which TEOS gas, ozone gas, and oxygen gas were introduced into the vessel 1 at flow rates of 10 SCCM, 100 SCCM and 100 SCCM, respectively, while maintaining the temperature of the sample 4 at 300° C. and the pressure in the vessel 1 at 1 Tort. Formed on the surface of the sample 4 was a thin film which exhibited, as shown in FIG. 3, good step coverage to a trench 4a made in the surface of the sample 4. This thin insulating film was grown to a predetermined thickness. Then, it came to have a flat upper surface as is evident from FIG. 3.

This successful forming of a thin film exhibiting good step coverage may be attributed to the various reactions in the vessel 1, which will be described in the following.

Oxygen ($O_2$) being supplied into the vessel 1 is excited with the plasma and converted to oxygen atoms, as illustrated by Formula (1):

$$O_2 + e \rightarrow O + O + e \qquad (1)$$

Meanwhile, ozone reacts with TEOS in the vessel 1, forming a condensative intermediate product having excellent step coverage, as indicated by Formula (2):

$$TEOS + O_3 \rightarrow Si(OC_2H_5)_4 O_3 \qquad (2)$$

Being a liquid, this intermediate product fills the trench 4a, leaving no void therein. The intermediate product also reacts with the oxygen atoms (O) shown in Formula (1), as illustrated by Formula (3):

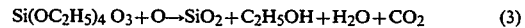

$$Si(OC_2H_5)_4 O_3 + O \rightarrow SiO_2 + C_2H_5OH + H_2O + CO_2 \qquad (3)$$

In Embodiment 1, the oxygen gas ($O_2$) may be replaced by an oxygen-containing gas such as $N_2O$, $NO_2$, or the like. In this case, as well, the same advantage as described above can be attained as will be explained in the following. The oxygen-containing gas, for example N₂O, is excited by the excitation device 9 and then supplied into the reaction vessel 1 through the gas inlet 8, while TEOS and ozone are introduced into the vessel 1 via the gas inlets 6 and 7, respectively, without being excited.

An experiment was carried out, in which N₂O was introduced into the vessel 1, while maintaining the temperature of the sample 4 at 300° C. and the pressure in the vessel 1 at 1 Tort. Formed on the surface of the sample 4 was a thin film which exhibited, as shown in FIG. 3, good step coverage to a trench 4a made in the surface of the sample 4. The thin insulating film had a flat upper surface as is shown in FIG. 3, too.

Comparative Example

A conventional CVD method, wherein TEOS is used as the feed gas and ozone as the sole reaction gas, will be studied here.

A film deposited by means of the CVD method exhibits but insufficient insulating property. The reason for this may be as follows. TEOS and ozone react, as indicated in Formula (2), forming an intermediate product:

$$TEOS + O_3 \rightarrow Si(OC_2H_5)_4\, O_3 \quad (2)$$

The intermediate product generates SiO₂ as is shown in Formula (4):

$$Si(OC_2H_5)_4\, O_3 \rightarrow Si(OH_2)O + C_2H_5OH \rightarrow SiO_2.H_2O \quad (4)$$

As can be understood from Formula (4), the SiO₂ film contains H₂O and inevitably has poor a insulating property.

Embodiment 2

FIG. 4 is a schematic representation of a vapor-phase growth apparatus for effecting a vapor-phase growth method which is a second embodiment of the invention. Some of the components of this apparatus are identical to those shown in FIG. 2, and are therefore designated at the same reference numerals in FIG. 4 and will not be described in detail.

The second embodiment differs from the first in that ozone and an oxygen-containing gas are alternately introduced into the reaction vessel 1.

As is shown in FIG. 4, valves 10, 11 and 12 are located in the gas inlets 6, 7 and 8, respectively. The valve 10 can be dispensed with. The valves 11 and 12 are controlled to open and close of any timing under the control of a valve controller 15. More precisely, the valve controller 15 opens and closes the valves 11 and 12 alternately, so that ozone and oxygen-containing gas are alternately supplied into the reaction vessel 1.

TEOS introduced into the vessel 1 via the gas inlet port 6 reacts with the plasma-excited O₂ and the ozone alternately on the surface of the sample 4, thus forming an insulating film thereon. At this time, an intermediate product is formed in the reaction vessel 1. The intermediate product condenses into a liquid, which flows into the narrow trenches made in the surface of the sample 4, by virtue of its surface tension. Eventually, a thin film is formed on the sample 4, filling each trench, with excellent step coverage.

An experiment was performed, in which TEOS gas, ozone gas, and oxygen gas were supplied into the vessel 1 at flow rates of 10 SCCM, 100 SCCM and 100 SCCM, respectively, while maintaining the temperature of the sample 4 at 300° C. and the pressure in the vessel 1 at 1 Torr. Then, a thin film was formed on the surface of the sample 4. The thin film, thus formed, exhibited, as shown in FIG. 3, good step coverage to a trench 4a made in the surface of the sample 4. When the thin film was grown to a predetermined thickness, it came to have a flat upper surface as is illustrated in FIG. 3.

This successful forming of a thin film exhibiting good step coverage may be ascribed to the various reactions in the vessel 1, which will be described in the following.

When oxygen (O₂) is supplied into the vessel 1, it is excited with the plasma and converted to excited oxygen atoms, as in Embodiment 1 and as illustrated by Formula (1):

$$O_2 + e \rightarrow O + O + e \quad (1)$$

When ozone is introduced into the vessel 1, it reacts with TEOS in the vessel 1, forming an intermediate product. The intermediate product condenses into a liquid which has excellent step coverage, as indicated by Formula (2):

$$TEOS + O_3 \rightarrow Si(OC_2H_5)_4\, O_3 \quad (2)$$

Being a liquid, this intermediate product flows into the trench 4a. When ozone is not supplied into the reaction vessel, the product reacts in each trench 4a with the oxygen atoms (O) which have been generated in the plasma, in the same way as in Embodiment 1, as is by Formula (3):

$$Si(OC_2H_5)_4\, O_3 + O \rightarrow SiO_2 + C_2H_5OH + H_2O + CO_2 \quad (3)$$

Thus, SiO₂ is formed, whereby a thin film exhibiting good step coverage is formed on the surface of the sample 4.

Since the supply of ozone and the supply of excited oxygen are alternately effected, Embodiment 2 is advantageous in that such a secondary reaction as would form powder or dust in the vessel 1 can be suppressed. As indicated above, TEOS and ozone react, forming an intermediate product—not in each trench 4a but in the space within the vessel 1. If excited oxygen atoms (O) react with this intermediate product, SiO₂ will be formed inevitably in the space within the reaction vessel 1. In Embodiment 2, excited O₂ is introduced, instead of ozone, into the vessel 1 after the intermediate product has flowed into the trenches 4a. This specific measure taken, SiO₂ containing no impurities is successfully formed in the trenches 4a.

It is desirable that the supply of ozone and the excitation of O₂ be switched so that ozone may be supplied for a period longer than O₂ is excited.

TEOS may be introduced into the vessel 1 by opening the valve 11 (FIG. 4) in synchronism with the supply of ozone. That is, the supply of TEOS may be interrupted while O₂ is being excited, activated and supplied. Embodiment 3.

Figure 5:
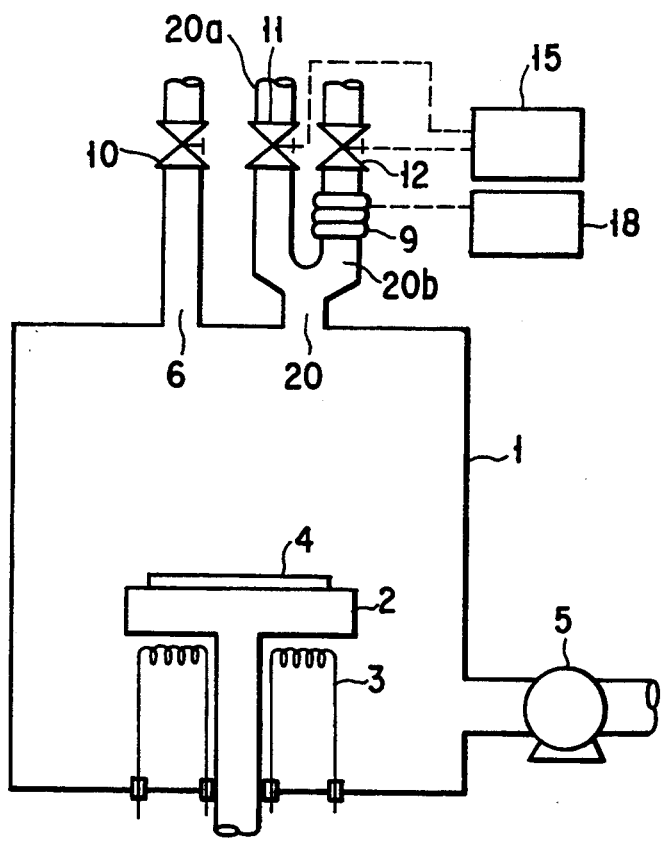
FIG. 5 is a side view schematically showing a vapor-phase growth apparatus for carrying out a vapor-phase growth method according to a third embodiment of the this invention.

FIG. 5 schematically shows a vapor-phase growth apparatus for carrying out a vapor-phase growth method which is a third embodiment of the invention.

The third embodiment differs from Embodiment 2, in that ozone and an oxygen-containing gas are alternately introduced into the reaction vessel 1 through a single gas inlet, not through two gas inlets as practiced in Embodiment 2.

As shown in FIG. 5, a gas inlet 20 is used, replacing the gas inlets 7 and 8 shown in FIG. 4. The upper end of the gas inlet 20 is coupled to two gas-supplying pipes 20a and 20b. The gas-supplying pipe 20b is connected to an excitation device 9. Valves 11 and 12 are located in the pipes 20a and 20b, respectively. A valve controller 15 is connected to both valves 11 and 12, for controlling the timing of opening and closing the valves 11 and 12. An excitation controller 18 is connected to the excitation device 9, for controlling the excitation device 9. Except for these structural features, the vapor-phase growth apparatus of FIG. 5 is identical to the apparatus shown in FIG. 4. Therefore, the other structural features of the apparatus will not be described.

Embodiment 3 performs the same operation and, hence, achieves the same advantage as Embodiment 2.

Embodiment 4

Figure 6:
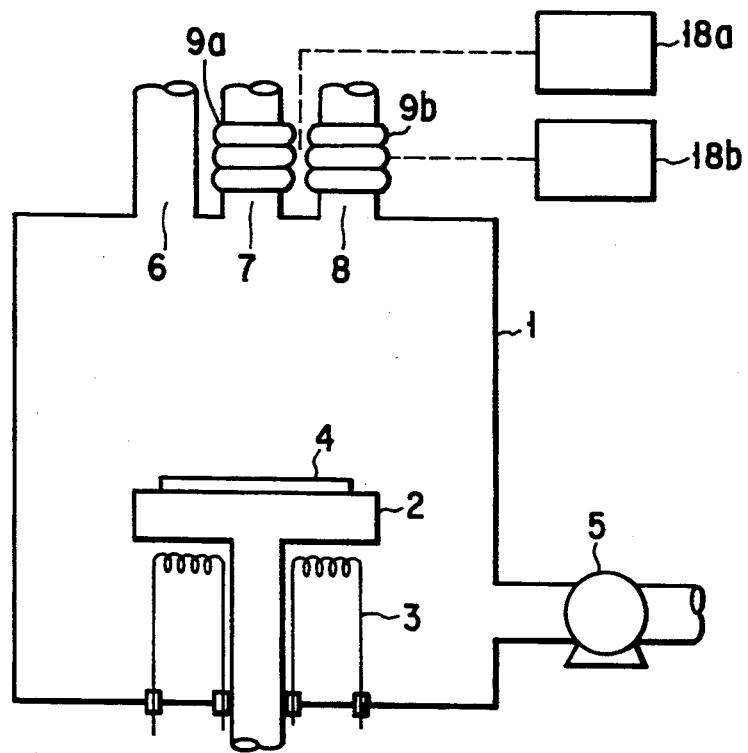
FIG. 6 is a side view schematically showing a vapor-phase growth apparatus for performing a fourth embodiment of the present invention.

FIG. 6 schematically shows a vapor-phase growth apparatus designed to perform a fourth embodiment of the present invention.

This apparatus differs from the apparatus of FIG. 2 in that oxygen or oxygen-containing gas, not ozone, is supplied to a gas inlet and therein, thus generating ozone, which is introduced into the reaction vessel. That is, the apparatus shown in FIG. 6 is characterized in two respects. First, two gas inlets are used for supplying an oxygen-containing gas into the vessel. Second, two excitation devices are connected to these gas inlets, for exciting the oxygen in the gas inlets under such different conditions that ozone and excited oxygen are generated in the gas inlets, respectively.

To be more specific, as shown in FIG. 6, the apparatus has three gas inlets 6, 7 and 9 in the top of the reaction vessel 1. The gas inlet 6 is used to introduce a feed gas into the vessel 1. The gas inlets 7 and 8 are used to introduce oxygen or oxygen-containing gas into the reaction vessel 1. Excitation devices 9a and 9b are coupled to the gas inlets 7 and 8, respectively. Excitation controllers 18a and 18b are connected to the excitation devices 9a and 9b, respectively, to supply first and second signals to the excitation devices 9a and 9b, respectively, thereby to drive devices 9a and 9b in different conditions.

In operation, the feed gas is supplied into the reaction vessel 1 via the gas inlet 6. Driven by the first signal from the controller 18a, the excitation device 9a excites oxygen or oxygen-containing gas in the gas inlet 7, thereby generating ozone. At the same time, driven by the second signal from the controller 18b, the excitation device 9b excites oxygen or oxygen-containing gas in the gas inlet 8, thereby generating excited oxygen (O). The ozone and the excited oxygen, thus generated, are supplied into the reaction vessel 1 from the gas inlets 7 and 8.

It will now be explained how Embodiment 4 is performed by the apparatus of FIG. 6 in order to deposit a silicon oxide film on a sample 4.

TEOS (Tetraethoxysilane), for example, is supplied as feed gas into the vessel 1 through the gas inlet 6, without being excited, just as in Embodiment 1. Meanwhile, oxygen, for example, is excited in the gas inlets 7 and 8 under different conditions by means of the excitation devices 9a and 9b, whereby ozone and excited oxygen are generated. Ozone and excited oxygen are introduced into the reaction vessel 1 from the gas inlets 7 and 8.

An experiment was conducted, in which TEOS gas was introduced into the vessel 1 at flow rate of 10 SCCM, and oxygen gas was supplied to the gas inlets 7 and 8 at flow rates of 100 SCCM and 100 SCCM, respectively. Simultaneously, the oxygen gas was excited in the gas inlets 7 and 8 under different conditions by the excitation devices 9a and 9b. During these simultaneous processes, the temperature of the sample 4 was maintained at 300° C., and the pressure in the vessel 1 was held at 1 Torr. Then, a thin silicon oxide film was grown on the surface of the sample 4. The silicon oxide film, thus formed, exhibited, as shown in FIG. 3, good step coverage to a trench 4a made in the surface of the sample 4. The thin film was further grown to a predetermined thickness. Then, it came to have a flat upper surface as is shown in FIG. 3.

This successful forming of a thin film exhibiting good step coverage can be said to have been derived from the various reactions in the vessel 1, which will be described in the following.

Oxygen gas ($O_2$) is excited with the plasma into excited oxygen atoms (O), as in Embodiment 1 and as illustrated by Formula (1):

$$O_2 + e \rightarrow O + O + e \qquad (1)$$

The oxygen atoms (O) obtained by plasma excitation reacts not only with TEOS, but also with the remaining oxygen ($O_2$), thereby generating ozone. Namely:

$$O + O_2 \rightarrow O_3 \qquad (5)$$

The higher the pressure on the oxygen gas, and the less intense the plasma, the more greatly the reaction of Formula (5) will be accelerated.

The ozone generated through the reaction of Formula (5) reacts with TEOS, forming an intermediate product. This product condenses into a liquid which has excellent step coverage, as indicated by Formula (2):

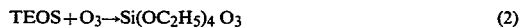

$$TEOS + O_3 \rightarrow Si(OC_2H_5)_4 \cdot O_3 \qquad (2)$$

Being a liquid, this intermediate product readily flows into the trench 4a, filling up the trench 4a. In the trench 4a, the product reacts with the oxygen atoms (O) which have been generated in the plasma, forming $SiO_2$ in the same way as in Embodiment 1 and as illustrated by Formula (3):

$$Si(OC_2H_5)_4 \cdot O_3 + O \rightarrow SiO_2 + C_2H_5OH + H_2O + CO_2 \qquad (3)$$

Since the excitation devices 9a and 9b connected to the gas inlets 7 and 8 excite oxygen under different conditions, thus garnering ozone and excited oxygen, the reactions of Formulas (2) and (3) proceed at the same time. Hence, a silicon oxide film exhibiting good step coverage and sufficient insulating property is deposited on the surface of the sample 4.

In Embodiment 4, the oxygen gas ($O_2$) may be replaced by an oxygen-containing gas such as $N_2O$, $NO_2$, or the like. In this case, as well, the same advantages can be attained as in Embodiments 1 to 3.

Embodiment 5.

Figure 7:
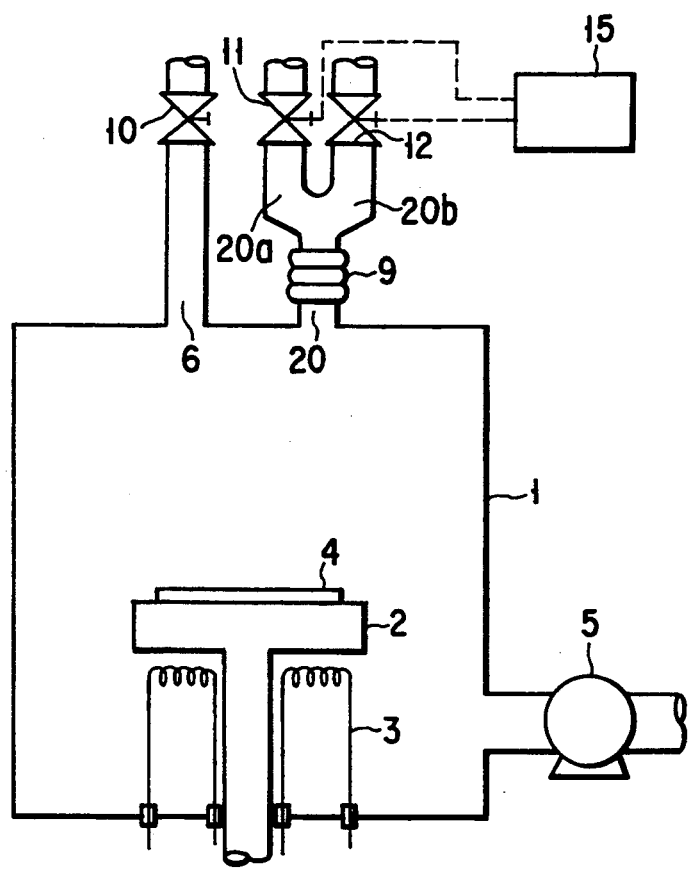
FIG. 7 is a side view schematically showing a vapor-phase growth apparatus for accomplishing a fifth embodiment of the this invention.

FIG. 7 is a schematic representation of a vapor-phase growth apparatus for effecting a fifth embodiment of the invention, more appropriately a modification of Embodiment 4.

Embodiment 5 differs from Embodiment 4 in regard to the method of exciting oxygen gas or oxygen-containing gas to generate ozone and excited oxygen.

As shown in FIG. 7, two gas inlets 6 and 20 are provided in the top of the reaction vessel 1. The gas inlet 6 is used to introduce TEOS (i.e., the feed gas) into the vessel 1, and the gas inlet 20 for introducing ozone and excited oxygen into the vessel 1. An excitation device 9 is coupled to the gas inlet 20. The upper end of the gas inlet 20 is coupled to two gas-supplying pipes 20a and 20b. Valves 11 and 12 are located in the pipes 20a an 20b, respectively. Valve controller 15 is connected to both valves 11 and 12, for opening these valves alternately and closing them alternately.

A reaction gas, such as oxygen gas or oxygen-containing gas, is supplied through the pipes 20a and 20b in different conditions. For instance, when oxygen gas is supplied via the pipe 20a at a pressure lower than it is supplied via the pipe 20b, it is excited by the excitation device 9. Namely:

$$O_2 + e \rightarrow O + O + e \quad (1)$$

When oxygen gas is supplied from the pipe 20b and, hence, at the high pressure, it is excited by the excitation device 9 as indicated by the following Formula:

$$O + O_2 \rightarrow O_3 \quad (5)$$

Namely, the higher the pressure on the oxygen gas, the more readily the reaction of Formula (5) proceeds, generating ozone ($O_3$).

Thus, the excitation device 9 excites the oxygen gas supplied via the pipe 20a at a low pressure, generating excited oxygen, and also excites the oxygen gas supplied via the pipe 20b at a high pressure, generating ozone. As a result, Embodiment 5 achieves the same advantage as Embodiment 4.

In Embodiment 5, excited oxygen and ozone are alternately introduced into the reaction vessel 1, by virtue of alternate switching of the valves 11 and 12 located in the pipes 20a and 20b. Hence, such a secondary reaction as would form powder or dust can be prevented from occurring in the space within the vessel 1, as in Embodiment 2.

Figure 8:
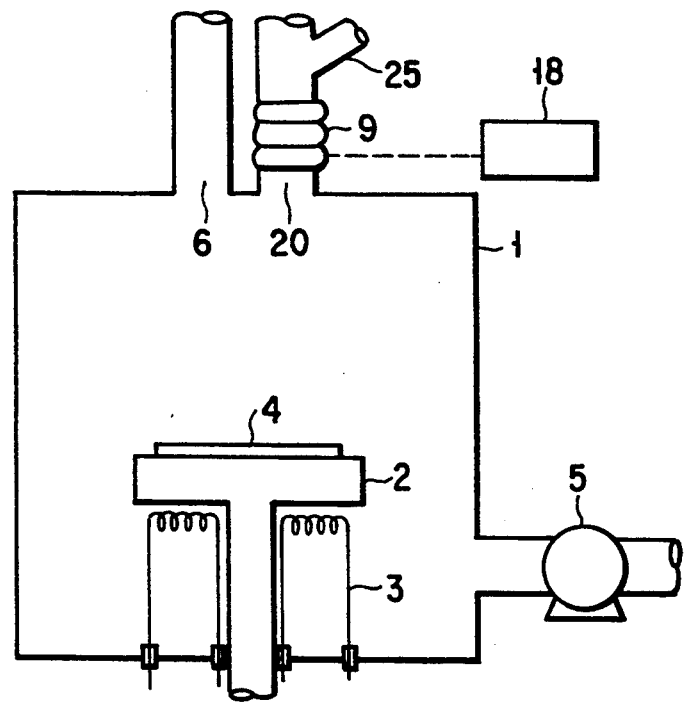
FIG. 8 is a side view schematically illustrating a modification of the vapor-phase growth apparatus shown in FIG. 7.

FIG. 8 schematically illustrates a modification of the apparatus shown in FIG. 7. In the modified apparatus, a pressure-adjusting means such as a pressure-adjusting pipe 25 is used, through which oxygen is forced into the gas inlet 20, when necessary, thereby raising the pressure of the oxygen in the gas inlet 20 to promote the reaction of Formula (5) and subsequently to generate ozone ($O_3$).

In Embodiment 5, the same reaction gas (i.e., oxygen) is set at different pressures before it is excited. Alternatively, the reaction gas may be supplied to the excitation site via two passages under the same pressure, and another reaction gas (e.g., argon) may be mixed with the gas flowing through one of the passages but not with the gas flowing through the other passage.

Embodiment 6

FIG. 9 is a schematic representation of a vapor-phase growth apparatus for performing a sixth embodiment of this invention. The sixth embodiment is a modification of Embodiment 5, and differs in the method of exciting oxygen or oxygen-containing gas to generate ozone and excited oxygen.

As illustrated in FIG. 9, an excitation controller 18 is connected to an excitation device 9. The controller 18 is designed to periodically turn the excitation device 9 on and off or to control an input voltage of the excitation device 9.

First, the excitation device 9 is turned on, and excites oxygen ($O_2$) used as reaction gas, causing the following reaction in the gas inlet 20:

$$O_2 + e \rightarrow O + O + e \quad (1)$$

Then, the device 9 is turned off. Then, the excited oxygen (O) generated in the reaction of Formula (1) reacts with oxygen ($O_2$) in the gas inlet 20, whereby ozone ($O_3$) is generated. Namely:

$$O + O_2 \rightarrow O_3 \quad (5)$$

As the excitation controller 18 turns the device 9 on and off repeatedly, the reactions of Formulas (1) and (5) take place alternately. Therefore, such a secondary reaction as would form powder or dust can be prevented from occurring in the space within the vessel 1, as in Embodiment 2.

The ozone, generated when the excitation device 9 remains off, is supplied into the reaction vessel 1 and reacts with TEOS introduced into the vessel 1 via the gas inlet 6. The intermediate product represented in Formula (2) is thereby formed—not in the trenches 4a formed in the surface of the sample 4, but in the space within the reaction vessel 1. Should the excited oxygen (O) remain in the space, it would react with the intermediate product, forming powder or dust. To prevent this from happening, the excitation device 9 is alternately turned on and off such that the excited oxygen (O) is not introduced into the vessel 1 until the intermediate product flows into the trenches 4a. This measure taken, $SiO_2$ containing no impurities is formed in each trench 4a.

It is desirable that the excitation device 9 be turned on and off repeatedly, at such times that it remains off longer than it remains on. This is because ozone should better be supplied into the vessel 1 for a longer period than the excited oxygen.

TEOS may be supplied into the vessel 1 in synchronism with the generating of ozone; its supply may be interrupted while the excited oxygen is being introduced into the reaction vessel 1. To this end, a valve may be arranged in the upstream end of the gas inlet 6, in order to adjust the timing of supplying TEOS.

The excitation device 9 may be a plasma device for performing the reaction of Formula (5), i.e., the generating of ozone. In this case, the lower the voltage applied to the plasma device, the faster the reaction proceeds. Hence, the input voltage of the plasma device may, therefore, be changed by means of the excitation controller 18.

Embodiment 7

FIG. 10 schematically illustrates a vapor-phase growth apparatus for effecting a seventh embodiment of the invention. The seventh embodiment differs from Embodiments 1 to 6, in that gas which generates no reaction product is supplied into the vessel 1.

The apparatus shown in FIG. 10 is identical to the apparatus of FIG. 2, except for two points. First, a gas inlet 30 is formed in the top of the vessel 1, in addition to the gas inlets 6, 7 and 8. Second, an excitation device 31 is coupled to the gas inlet 30.

In Embodiment 7, TEOS, ozone and oxygen are introduced into the vessel 1 through the gas inlets 6, 7 and 8, respectively, as in Embodiment 1. Furthermore, argon (Ar), for example, is supplied into the vessel 1 through the gas inlet 30. The excitation device 31 excites argon passing through the gas inlet 30.

It will be explained how Embodiment 7 is performed by the apparatus of FIG. 10 in order to deposit a silicon oxide film on a sample 4.

As in Embodiment 1, TEOS (Tetraethoxysilane), for example, is supplied as feed gas into the vessel 1 via the gas inlet 6, without being excited. In the meantime, ozone ($O_3$) is supplied as a reaction gas into the vessel 1 through the gas inlet 7, without being excited, and oxygen ($O_2$) is supplied as another reaction gas into the vessel 1 through the gas inlet 8, while being excited by the excitation device 9 connected to the gas inlet 8. At the same time, argon is introduced into the vessel 1, while being excited by the excitation device 31.

An experiment was performed, in which TEOS gas, ozone gas, oxygen gas, and argon gas were supplied into the vessel 1 at flow rates of 10 SCCM, 100 SCCM, 100 SCCM and 10 SCCM, respectively, while maintaining the temperature of the sample 4 at 300° C. and the pressure in the vessel 1 at 1 Torr. Then, a thin silicon oxide film was formed on the surface of the sample 4. The thin silicon oxide film, thus formed, exhibited, as shown in FIG. 3, good step coverage to a trench. 4a made in the surface of the sample 4. When the thin film was grown to a predetermined thickness, it came to have a flat upper surface as is shown in FIG. 3.

This successful forming of a thin film exhibiting good step coverage may be ascribed to the chemical reactions represented by Formulas (1), (2) and (3), which have been described in conjunction with Embodiment 1. At the same time these reactions proceed in the vessel 1, the argon excited by the plasma, $Ar^+$, is applied onto the surface of the sample 4.

The intermediate product of the reaction identified by Formula (2) hardly adheres to the vertical surfaces of each trench 4a made in the surface of the sample 4; it readily flows deep into the trench 4a. As the excited argon $Ar^+$ is applied onto the surface of the sample 4, it expels $H_2O$ formed in the reaction of Formula (3) from the surface of the sample 4. Hence, dehydration is achieved at the surface of the sample 4, which helps to grow a silicon oxide film having a good insulating property.

Embodiment 8

Figure 11:
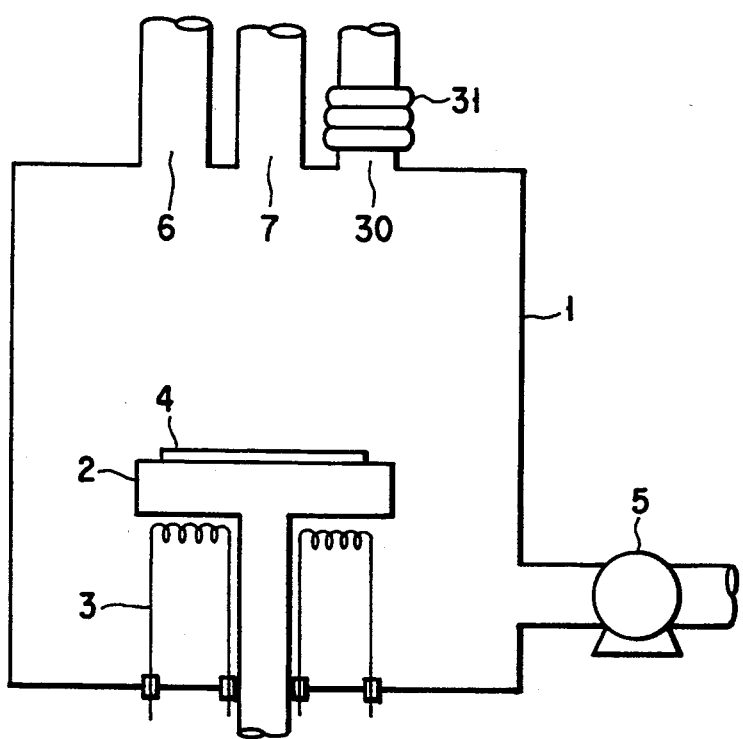
FIG. 11 is a side view schematically showing a vapor-phase growth apparatus for performing an eighth embodiment of the present invention.

FIG. 11 schematically shows a vapor-phase growth apparatus for carrying out an eighth embodiment of the invention. The eighth embodiment is a modification of Embodiment 7, and differs in that oxygen ($O_2$) is not supplied into the reaction vessel 1 and that TEOS reacts with ozone only in the reaction vessel 1. Hence, TEOS and ozone are introduced into the vessel 1 via the gas inlets 6 and 7, without being excited, and a gas not forming a reaction product, e.g., argon (Ar), is supplied into the vessel 1 via the gas inlet 30, while being excited by the excitation device 31.

In the vessel 1, TEOS and ozone undergo the reactions of Formulas (2) and (4), as in Embodiment 1. As the reaction of Formula (4) proceeds, an $SiO_2$ film grows on the surface of the sample 4. As Formula (4) teaches, the $SiO_2$ film contains impurities such as $H_2O$ and fails to have a sufficient insulating property. Nonetheless, the $SiO_2$ film is dehydrated in Embodiment 8. This is because the excited argon $Ar^+$ expels $H_2O$ from the film as it is applied onto the surface of the sample 4.

Thus, it is possible to grow a $SiO_2$ film excelling in insulating property, despite that TEOS is reacted with ozone only as in the conventional vapor-phase growth method.

Embodiment 9

Figure 12:
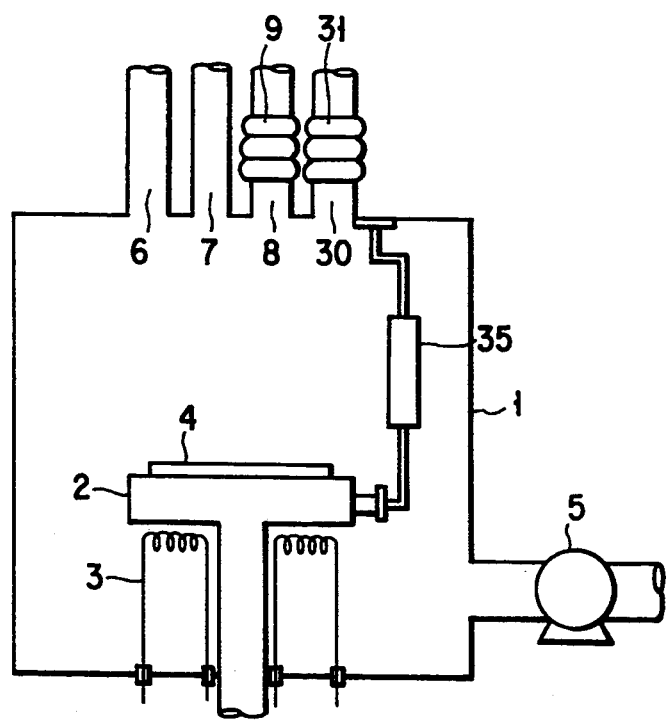
FIG. 12 is a side view schematically showing a vapor-phase growth apparatus for performing a ninth embodiment of the present invention.

FIG. 12 schematically shows a vapor-phase growth apparatus for performing a ninth embodiment of the present invention. The ninth embodiment is a modification of the Embodiment 7 or the Embodiment 8 and is characterized in that a bias voltage is applied between the sample 4 and the gas inlets, thereby to accelerate excited gas, which form no reaction product, and force it onto the surface of the sample 4.

As shown in FIG. 12, four gas inlets 6, 7, 8 and 30 are formed in the top of the reaction vessel 1, for introducing TEOS, ozone, oxygen, and gas forming no reaction product, e.g., argon, into the reaction vessel 1, respectively. Excitation devices 9 and 31 are coupled to the gas inlets 8 and 30, for exciting the oxygen and argon passing through the inlets 8 and 30, respectively. Furthermore, a bias voltage applying device 35 is arranged within the vessel 1, connected at one end to the sample holder 2 and that portion of the vessel 1 which is located near the gas inlet 30. Hence, the device 35 can apply a bias voltage between the sample 4 placed on the holder 4 and the gas inlet 30.

As in Embodiment 7, TEOS (Tetraethoxysilane), for example, is supplied as feed gas into the vessel 1 via the gas inlet 6, without being excited. Meanwhile, ozone ($O_3$) is supplied as a reaction gas into the vessel 1 through the gas inlet 7, without being excited, and oxygen ($O_2$) is supplied as another reaction gas into the vessel 1 through the gas inlet 8, while being excited by the excitation device 9. At the same time, argon is introduced into the vessel 1, while being excited by the excitation device 31.

As a result, a thin silicon oxide film is grown on the surface of the sample 4 as in Embodiment 7. The argon excited by the plasma, i.e., $Ar^+$, is accelerated by the bias voltage applied between the gas inlet 30 and the sample 4 and subsequently forced onto the surface of the sample 4, with great impact energy. The dehydration explained in conjunction with Embodiments 7 and 8 is thereby promoted at the surface of the sample 4. Hence, a thin film is be formed on the sample 4, which exhibits good step coverage and, moreover, excels in insulating property.

Embodiment 9 may be modified as shown in FIG. 13, so that it may carry out TEOS-ozone reaction of the same type as Embodiment 8. In the modified embodiment, as well, $Ar^+$ is accelerated by the bias voltage applied between the gas inlet 30 and the sample 4 and hence forced onto the surface of the sample 4, with great impact energy. The dehydration at the surface of the sample 4 is thereby promoted. Hence, a thin film is formed on the sample 4, which exhibits good step coverage and, moreover, excels in insulating property, despite that TEOS is reacted with ozone only as in the conventional vapor-phase growth method.

Embodiment 10

FIG. 14 is a schematic illustration of a vapor-phase growth apparatus for performing a tenth embodiment of this invention. The tenth embodiment differs from Embodiments 1 to 9, in that a gas containing a group VII element is introduced, along with other gases, into the reaction vessel 1.

The apparatus shown in FIG. 14 is identical to the apparatus of FIG. 2, except for two points. First, a gas inlet 40 is formed in the top of the vessel 1, in addition to the gas inlets 6, 7 and 8. Second, an excitation device 41 is coupled to the gas inlet 30.

In Embodiment 10, TEOS, ozone and oxygen are introduced into the vessel 1 through the gas inlets 6, 7 and 8, respectively, as in Embodiment 1. Furthermore, a gas containing a group VII element, for example, NF$_3$, is supplied into the vessel 1 through the gas inlet 40. The excitation device 41 excites NF$_3$ as this gas passes through the gas inlet 30.

It will be explained how Embodiment 10 is performed by the apparatus of FIG. 14 in order to deposit a silicon oxide film on a sample 4.

As in Embodiment 1, TEOS (Tetraethoxysilane), for example, is supplied as feed gas into the vessel 1 via the gas inlet 6, without being excited. In the meantime, ozone (O$_3$) is supplied as a reaction gas into the vessel 1 through the gas inlet 7, without being excited, and oxygen (O$_2$) is supplied as another reaction gas into the vessel 1 via the gas inlet 8, while being excited by the excitation device 9 connected to the gas inlet 8. Meanwhile, NF$_3$ is introduced into the vessel 1, while being excited by the excitation device 41.

An experiment was performed, in which TEOS gas, ozone gas, oxygen gas, and NF$_3$ gas were supplied into the vessel 1 at flow rates of 10 SCCM, 100 SCCM, 100 SCCM and 10 SCCM, respectively, while maintaining the temperature of the sample 4 at 300° C. and the pressure in the vessel 1 at 1 Torr. Then, a thin silicon oxide film was formed on the surface of the sample 4. The thin silicon oxide film, thus formed, exhibited, as shown in FIG. 3, good step coverage to a trench 4a made in the surface of the sample 4. The thin film was grown to a predetermined thickness. Then, it came to have a flat upper surface as is illustrated in FIG. 3.

This successful forming of a thin film exhibiting good step coverage may be attributed to the chemical reactions represented by Formulas (1), (2) and (3), which have been described in conjunction with Embodiment 1. At the same time these reactions proceed in the vessel 1, NF$_3$ excited by the plasma generates F, which etches away either edge of each trench 4a formed in the surface of the sample 4. Namely:

$$SiO_2 + F \rightarrow SiF_4 + O_2 \qquad (6)$$

As mentioned above, the intermediate product of the reaction identified by Formula (2) hardly adheres to the vertical surfaces of each trench 4a, and readily flows into the trench 4a. In the meantime, F generated from NF$_3$ excited by plasma etches away the edge of each trench 4a. A thin silicon oxide film can therefore be grown, which exhibits good step coverage and has a flat upper surface even at the portion lying right above the trench 4a.

Embodiment 11

FIG. 15 schematically shows a vapor-phase growth apparatus for effecting an eleventh embodiment of the present invention. The eleventh embodiment differs from Embodiments 1 to 10, in that a silicon-containing gas and oxygen or an oxygen-containing gas are supplied into the reaction vessel 1, in place of ozone.

The eleventh embodiment will be described in comparison with Embodiment 1.

As may be understood from FIG. 15, the apparatus differs from the apparatus of FIG. 2 designed for performing the method of Embodiment 1, only in that it has no gas inlet for introducing ozone into the reaction vessel 1. That is, only two gas inlets 6 and 8 are arranged in the top of the vessel 1. An excitation device 9 is coupled to the gas inlet 8, while being excited by the device 9. Through the gas inlet 8, oxygen gas (O$_2$), for example, is supplied into the vessel 1, while being excited by the device 9. Through the gas inlet 6, a silicon-containing gas, e.g., TEOS, is introduced into the vessel 1, without being excited.

As oxygen (O$_2$) is excited, the following reactions proceed as has been described:

$$O_2 + e \rightarrow O + O + e \qquad (1)$$

$$O + O_2 \rightarrow O_3 \qquad (5)$$

Oxygen atoms (O) and ozone (O$_3$) are thereby generated. Ozone, generated as indicated by Formula (5), reacts with TEOS as indicated by Formulas (2) and (3), forming an intermediate product which readily condenses and which therefore excels in step coverage. Namely:

$$TEOS + O_3 \rightarrow Si(OC_2H_5)_4\ O_3 \qquad (2)$$

The intermediate product fills the trenches 4a formed in the surface of the sample 4 and is eventually deposited on the surface thereof. It reacts with oxygen atoms (O) which have been generated in the plasma as indicated by Formula (1), as indicated below:

$$Si(OC_2H_5)_4\ O_3 + O \rightarrow SiO_2 + C_2H_5OH + H_2O + CO_2 \qquad (3)$$

As a result, a thin silicon oxide (SiO$_2$) film is formed on the surface of the sample 4. This thin film excels in step coverage and has a good insulating property.

Instead of oxygen gas (O$_2$), an oxygen-containing gas such N$_2$O, NO$_2$ or the like may be introduced via the gas inlet 8 into the reaction vessel 1. In this case, too, a thin silicon oxide film is formed on the sample 4, which excels in step coverage and exhibits a good insulating property.

Embodiment 11 can be performed not only by the apparatus of FIG. 15 which is a modification of the apparatus of FIG. 2 for performing Embodiment 2, but also by the apparatuses which are designed to effect the methods of Embodiments 2 to 10.

Embodiment 12

FIG. 16 schematically illustrates a vapor-phase growth apparatus for performing a twelfth embodiment of the invention. The twelfth embodiment differs from Embodiments 1 to 11, in that a mixture of oxygen gas or an oxygen-containing gas and at least one gas is supplied into the reaction vessel 1, the at least one gas having been selected from the group consisting of a rare gas, a gas capable of readily changing into cations and a gas capable of readily generating cations.

First, an example wherein oxygen gas and a rare gas is supplied into the vessel 1 will be described.

As shown in FIG. 16, an excitation device 9 is coupled to the gas inlet 8, and a gas-supplying pipe 50 is connected to that part of the gas inlet 8 which is located above the excitation device 9. TEOS, ozone, and oxygen are supplied into the vessel 1 through the gas inlets 6, 7 and 8, respectively, as in Embodiment 1. Simultaneously, gas containing a rare gas such as He or Ne is fed into the gas inlet 8 via the pipe 50 and is mixed with the oxygen gas in the gas inlet 8.

It will be explained how Embodiment 12 is performed by the apparatus of FIG. 16 in order to deposit a silicon oxide film on a sample 4.

As in Embodiment 1, TEOS (Tetraethoxysilane), for example, is supplied as feed gas into the vessel 1 via the gas inlet 6, without being excited. In the meantime, ozone ($O_3$) is supplied as a reaction gas into the vessel 1 through the gas inlet 7, without being excited, and oxygen ($O_2$) is mixed with He, for example, in the gas inlet 8, and the resultant mixture gas is supplied as another reaction gas into the vessel 1 via the gas inlet 8, while being excited by the excitation device 9.

An experiment was performed, in which TEOS gas, ozone gas, oxygen gas, and He gas gas were supplied into the vessel 1 at flow rates of 10 SCCM, 100 SCCM, 100 SCCM and 10 SCCM, respectively, while maintaining the temperature of the sample 4 at 300° C. and the pressure in the vessel 1 at 1 Torr. Then, a thin silicon oxide film was formed on the surface of the sample 4. The thin silicon oxide film, thus formed, exhibited good step coverage to a trench 4a made in the surface of the sample 4. The thin film was grown to a predetermined thickness. Then, it came to have a flat upper surface.

This successful forming of a thin film exhibiting good step coverage appears to have been accomplished by the various reactions in the vessel 1, which will be described in the following.

The TEOS-ozone reaction proceeds in the steps represented by Formulas (1), (2) and (3), which have been described in conjunction with Embodiment 1, thereby forming $SiO_2$. In Embodiment 11, He is mixed with $O_2$ in the gas inlet 8, forming a mixture gas, and the mixture gas is excited by the excitation device 9 coupled to the gas inlet 9. Oxygen gas ($O_2$) is decomposed with plasma and excited. Namely:

$$O_2 + e \rightarrow O + O + e \quad (1)$$

$$O + O_2 \rightarrow O_3 \quad (5)$$

Oxygen atoms (O) and ozone ($O_3$) are thereby generated. Since the rare gas, He (or Ne), has been mixed in a prescribed amount with $O_2$ in the gas inlet 8, more oxygen atoms (O) are generated than would be otherwise.

The inventors hereof conducted experiments, in which He gas was mixed with oxygen in various ratios ranging from of 0.01% to 50%, and the resultant mixture gas was excited, thereby generating oxygen atoms. It was found that more oxygen atoms were generated than in the case where He gas was not mixed to the oxygen gas at all.

The decomposition of oxygen gas appears to have been promoted by the following reactions:

$$He + e \rightarrow He^* + e \quad (7)$$

$$O_2 + He^* \rightarrow O_2^* + He \quad (8)$$

$$O_2^* \rightarrow O + O \quad (9)$$

Excited metastable He (He*) which has been generated in plasma through the reaction of Formula (7) dissociates the oxygen gas ($O_2$*) as indicated by Formula (8). Hence, the excited oxygen gas is immediately decomposed into oxygen atoms as illustrated in Formula (9). Since the collision cross section area in the reaction of Formula (7) is larger than in the reaction of Formula (1), the reaction of Formula (7) is quite liable to take place. So are the reactions of Formulas (8) and (9). This is why oxygen atoms and ozone molecules are generated in great numbers.

As has been explained, the plasma excites the oxygen gas ($O_2$), decomposing it into oxygen atoms (O). The addition of He to the oxygen gas serves to generate many oxygen atoms (O). An insulating film can therefore be formed which exhibits good step coverage.

Instead of He gas, either a gas which can readily change into cations or a gas which can readily generate cations may be supplied through the pipe 50 into the gas inlet 8 and thereby be mixed with the oxygen gas.

An example, wherein a gas which can readily change into cations is mixed with the oxygen gas in the gas inlet 8, will be described.

Suitable as gases capable of readily changing into cations are, for example: nitrogen monoxide gas, carbon monoxide gas, nitrogen gas, and rare gases having a relatively large molecular weight, including krypton gas, xenon gas and argon gas. Also suitable are: gases containing vapor of a group I or II metal such as potassium, lithium, cesium or calcium which is not gas at room temperature. These group I or II metals may be placed in plasma in the form of a mass or powder so that they may be vaporized to accelerate the decomposition of the oxygen gas.

When any one of these examples specified in the preceding paragraph is added to oxygen gas, the oxygen as will be readily decomposed into a great number of oxygen atoms. More precisely, when a mixture of oxygen gas and a gas capable of readily changing into cations is supplied into the vessel 1, cations increase in numbers in the plasma. The cations impinge on the electrodes and collide with the molecules of the other gases introduced into the vessel 1, thus releasing electrons e as indicated by the following formula:

$$X + e \rightarrow X^+ + 2^e \quad (10)$$

where X is gas which can readily change into actions.

As electrons (e) increase in number, the reaction of Formula (1) proceeds, promoting the decomposition of the oxygen gas. Thus, the gas capable of readily changing into cations, which has been mixed to the oxygen as, accelerate the decomposition of the oxygen gas into oxygen atoms, whereby an insulating film having good step coverage is formed on the sample 4.

An example, wherein a gas which can readily generate cations is mixed with the oxygen gas in the gas inlet 8, will be described.

Suitable as gases capable of readily generating cations are, for example: He gas, Ne gas, krypton gas, xenon gas and argon gas. There are some other gases which can be used as the gas capable of readily generating cations.

When He gas, for example, which can readily generate cations is mixed with the oxygen gas, the following reaction occurs:

$$He + e \rightarrow He^* + e \quad (7)$$

Excited metastable He*, is thereby generated. He* collides with the other gas X in the vessel 1, generating cations (X+). In other words, Penning effect takes place. Namely;

$$X + He^* \rightarrow X^+ + He + e \quad (11)$$

As the reaction of Formula (11) goes on, cations ($X^+$) and electrons increase in numbers, and the cations result in an increase in electrons in the plasma. Thus, the decomposition of the oxygen gas is promoted due to the reaction represented by Formula (1). The above-mentioned Penning effect also contributes to the dissociation of oxygen gas.

As described above, the plasma in the vessel 1 excites the oxygen gas ($O_2$), which is decomposed into oxygen atoms (O), and the gas mixed with the oxygen gas and capable of reading generating cations accelerates the decomposition of the oxygen gas, thus increasing the number of oxygen atoms in the reaction vessel 1. As a result of this, an insulating film exhibiting good step coverage will be formed on the sample 4.

Embodiment 13

This embodiment is concerned with a way of exciting oxygen gas. When gas X capable of readily changing into cations is mixed with oxygen gas, cations ($X^+$) in plasma increases in number. The numerous cations impinge on the electrodes and collide with the molecules of other gases in the reaction vessel 1, releasing electrons. Namely:

$$X + e \rightarrow X^+ + 2e \qquad (10)$$

As electrons (e) increase in number, the reaction of Formula (1) proceeds, promoting the decomposition of the oxygen gas. The gas X is, for example, nitrogen monoxide gas, krypton gas, xenon gas, argon gas, carbon monoxide gas, or nitrogen gas, or a hot gas containing vapor of a group I or II metal such as potassium, lithium, cesium or calcium which is not gas at room temperature. These group I or II metals may be placed in plasma in the form of a mass or powder so that they may be vaporized to accelerate the decomposition of the oxygen gas.

Embodiment 14

Embodiment 14 is also concerned with a way of exciting oxygen gas. When a rare gas, such as He or Ne, is mixed with oxygen gas, cations ($X^+$) in plasma increase in number. When excited through the reaction of Formula (7), a rare gas is converted into metastable gas (e.g., He* or Ne*), which collides with other gas X, generating cations ($X^+$). In other words, Penning effect takes place. Namely;

$$X + He^* \rightarrow X^+ + He + e \qquad (11)$$

As the reaction of Formula (11) goes on, cations ($X^+$) and electrons increase in numbers, and the cations result in an increase in electrons in the plasma. Thus, the decomposition of the oxygen gas is promoted due to the reaction represented by Formula (1). The above-mentioned Penning effect also contributes to the dissociation of oxygen gas.

As has been described thus far, the vapor-phase growth method and the apparatus therefore, according to the present invention, can form a thin film having good step coverage on a semiconductor substrate and in the trenches made in the surface thereof and having a high aspect ratio.

It is a thin $SiO_2$ which is formed in all embodiments described above. Nevertheless, this invention is not limited to these embodiments. The invention can be applied to form any other thin film, such as a SiON film, by using a silicon-containing gas, ozone and excited oxygen as major materials. To form a thin SiON film, it suffices to use, for example, $NH_3$ along with a silicon-containing gas, ozone, and excited oxygen.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A vapor-phase growth method for forming a silicon oxide film comprising the steps of:
   introducing a silicon-containing gas and ozone into a reaction vessel containing a sample and not containing plasma; and
   introducing excited oxygen obtained by exciting an oxygen gas or an oxygen-containing gas excluding silicon-containing gas and ozone, into the reaction vessel not containing plasma at the same time as, before, or after the silicon-containing gas and the ozone are introduced into the reaction vessel to deposit said silicon oxide film on the sample.

2. The method according to claim 1, wherein said silicon-containing gas is an organic oxysilane compound.

3. The method according to claim 2, wherein said organic oxysilane compound is at least one selected from the group consisting of tetraethoxysilane, tetramethoxysilane, tetraethyl silane, tetramethyl silane, triethoxysilane, diethoxysilane and monoethoxysilane.

4. The method according to claim 1, wherein said oxygen-containing gas is an oxide gas selected from the group consisting of $NO_2$ and $N_2O$.

5. The method according to claim 1, wherein said oxygen-containing gas is a mixture of an oxygen gas and a non-oxygen gas.

6. The method according to claim 1, wherein said oxygen or said oxygen-containing gas is excited by applying high-frequency electric power or ultraviolet rays to said oxygen or said oxygen-containing gas.

7. The method according to claim 1, wherein said ozone and said excited oxygen are alternately introduced into the reaction vessel.

8. The method according to claim 1, wherein said silicon-containing gas is introduced into the reaction vessel, substantially at the same time as said ozone is introduced into the reaction vessel.

9. The method according to claim 1, further compressing a step of introducing an excited gas incapable of forming a reaction product, into the reaction vessel.

10. The method according to claim 9, wherein said gas incapable of forming a reaction product is at least one selected from the group consisting of Ar, He, Xe and Ne.

11. The method according to claim 9, further comprising a step of applying a bias on said sample.

12. The method according to claim 11, wherein said bias is a voltage ranging from $-100$ V to $+100$ V.

13. The method according to claim 1, further comprising a step of introducing an excited gas containing a group VII element, into the reaction vessel.

14. The method according to claim 13, wherein said gas containing a group VII element is at least one selected from the group consisting of $NF_3$, $CF_4$, $C_2F_6$, $C_3F_8$, $CCl_4$ and $C_4F_{10}$.

15. The method according to claim 1, wherein at least one gas selected from the group consisting of a rare gas, a gas capable of readily changing into cations and a gas capable of readily generating cations is mixed with said oxygen, thereby forming a mixture gas, and the mixture gas is excited and introduced into the reaction vessel.

16. The method according to claim 15, wherein said gas capable of readily changing into cations is at least one selected from the group consisting of nitrogen monoxide, carbon monoxide, nitrogen, krypton, xenon and argon.

17. The method according to claim 15, wherein said gas capable of readily changing into cations is vapor of a group I or II element.

18. The method according claim 15, wherein said gas capable of readily generating cations is at least one selected from the group consisting of helium, neon, krypton, xenon and argon.

19. A vapor-phase growth method for forming a silicon oxide film comprising the steps of:
   introducing a silicon-containing gas into a reaction vessel containing a sample and not containing plasma; and
   introducing excited oxygen obtained by exciting an oxygen gas or an oxygen-containing gas excluding silicon-containing gas, into the reaction vessel not containing plasma at the same time as, before, or after the silicon-containing gas is introduced into the reaction vessel to deposit said silicon oxide film on the sample.

20. The method according to claim 19, wherein said oxygen or said oxygen-containing gas generates ozone when excited in a first excitation region and generates excited oxygen when excited in a second excitation region.

21. The method according to claim 20, wherein said step of introducing said ozone and said excited oxygen into the reaction vessel comprises a step of introducing excited oxygen from said first excitation region and a step of introducing ozone from said second excitation region.

22. The method according to claim 20, wherein said ozone and said excited oxygen are alternately introduced into the reaction vessel.

23. The method according to claim 20, wherein said silicon-containing gas is introduced into the reaction vessel, substantially at the same time as said ozone is introduced into the reaction vessel.

24. The method according to claim 20, wherein said ozone and said excited oxygen are introduced into the reaction vessel through a passage connected to said first and second excitation regions.

25. The method according to claim 19, wherein said oxygen or said oxygen-containing gas is excited in the same excitation region.

26. The method according to claim 19, wherein said silicon-containing gas is an organic oxysilane compound.

27. The method according to claim 26, wherein said organic oxysilane compound is at least one selected from the group consisting of tetraethoxysilane, tetramethoxysilane, tetraethyl silane, tetramethyl silane, triethoxysilane, diethoxysilane and monoethoxysilane.

28. The method according to claim 19, wherein said oxygen-containing gas is an oxide gas selected from the group consisting of $NO_2$ and $N_2O$.

29. The method according to claim 19, wherein said oxygen-containing gas is a mixture of an oxygen gas and a non-oxygen gas.

30. The method according to claim 19, wherein said oxygen or said oxygen-containing gas is excited by applying high-frequency electric power or ultraviolet rays to said oxygen or said oxygen-containing gas.

31. The method according to claim 19, further compressing a step of introducing an excited gas incapable of forming a reaction product, into the reaction vessel.

32. The method according to claim 19, wherein said gas incapable of forming a reaction product is at least one selected from the group consisting of Ar, He, Xe and Ne.

33. The method according to claim 31, further comprising a step of applying a bias on said sample.

34. The method according to claim 33, wherein said bias is a voltage ranging from $-100$ V to $+100$ V.

35. The method according to claim 19, further comprising a step of introducing an excited gas containing a group VII element, into the reaction vessel.

36. The method according to claim 35, wherein said gas containing a group VII element is at least one selected from the group consisting of $NF_3$, $CF_4$, $C_2F_6$, $C_3F_8$, $CCl_4$ and $C_4F_{10}$.

37. The method according to claim 19, wherein at least one gas selected from the group consisting of a rare gas, a gas capable of readily changing into cations and a gas capable of readily generating cations is mixed with said oxygen, thereby forming a mixture gas, and the mixture gas is excited and introduced into the reaction vessel.

38. The method according to claim 32, wherein said gas capable of readily changing into cations is at least one selected from the group consisting of nitrogen monoxide, carbon monoxide, nitrogen, krypton, xenon and argon.

39. The method according to claim 37, wherein said gas capable of readily changing into cations is vapor of a group I or II element.

40. The method according claim 37, wherein said gas capable of readily generating cations is at least one selected from the group consisting of helium, neon, krypton, xenon and argon.

41. A vapor-phase growth method for forming a silicon oxide film comprising the steps of:
   introducing a silicon-containing gas and ozone into a reaction vessel containing a sample and not containing plasma; and
   introducing an excited gas incapable of forming a reaction product, into the reaction vessel not containing plasma at the time as, before, or after the silicon-containing gas ad the ozone are introduced into the reaction vessel to deposit said silicon oxide film on the sample.

42. The method according to claim 41, wherein said silicon-containing gas is an organic oxysilane compound.

43. The method according to claim 42, wherein said organic oxysilane compound is at least one selected from the group consisting of tetraethoxysilane, tetramethoxysilane, tetraethyl silane, tetramethyl silane, triethoxysilane, diethoxysilane and monoethoxysilane.

44. The method according to claim 41, wherein said gas incapable of forming a reaction product is at least one selected from the group consisting of Ar, He, Xe, and Ne.

45. The method according to claim 41, further comprising a step of applying a bias on said sample.

46. The method according to claim 45, wherein said bias is a voltage ranging from −100 V to +100 V.

47. The method according to claim 41, further comprising a step of introducing an excited gas containing a group VII element, into the reaction vessel.

48. The method according to claim 47, wherein said gas containing a group VII element is at least one selected from the group consisting of $NF_3$, $CF_4$, $C_2F_6$, $C_3F_8$, $CCl_4$ and $C_4F_{10}$.

* * * * *

UNITED STATES PATENT AND TRADEMARK OFFICE
CERTIFICATE OF CORRECTION

PATENT NO. : 5,403,630
DATED : April 4, 1995
INVENTOR(S) : Isao MATSUI, et al.

It is certified that error appears in the above-indentified patent and that said Letters Patent is hereby corrected as shown below:

On the title page, Item [54] and Column 1, Lines 2-3, the title should read:

--VAPOR-PHASE GROWTH METHOD FOR FORMING $SiO_2$ Films--.

Signed and Sealed this

Twentieth Day of June, 1995

Attest:

BRUCE LEHMAN

*Attesting Officer*     *Commissioner of Patents and Trademarks*